(12) United States Patent
Tada et al.

(10) Patent No.: US 7,541,895 B2
(45) Date of Patent: Jun. 2, 2009

(54) ELECTRO MECHANICAL DEVICE AND MANUFACTURING METHOD THEREOF, AND RESONATOR AND MANUFACTURING METHOD THEREOF

(75) Inventors: Masahiro Tada, Kanagawa (JP); Shun Mitari, Kanagawa (JP); Shinya Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 261 days.

(21) Appl. No.: 11/733,025

(22) Filed: Apr. 9, 2007

(65) Prior Publication Data

US 2008/0238575 A1    Oct. 2, 2008

(30) Foreign Application Priority Data

Apr. 11, 2006    (JP) .............................. 2006-109097

(51) Int. Cl.
*H03H 9/00*    (2006.01)
*H03H 9/08*    (2006.01)
*H03H 9/10*    (2006.01)

(52) U.S. Cl. ...................................... 333/186; 333/191

(58) Field of Classification Search ................. 333/262, 333/186, 187, 188, 189, 190, 191, 192, 197
See application file for complete search history.

(56) References Cited

U.S. PATENT DOCUMENTS 7,002,436 B2 * 2/2006 Ma et al. ..................... 333/186
7,045,459 B2 * 5/2006 Freidhoff .................... 438/666
7,463,116 B2 * 12/2008 Naniwada ................... 333/186

FOREIGN PATENT DOCUMENTS

JP    2002-094328    3/2002

OTHER PUBLICATIONS

Clark T.C. Nguyen; Microelectromechanical Components for Miniaturized Low-Power Communications; IEEE MTT_S International Microwave Symposium RFMEMS Workshop; Jun. 18, 1999; pp. 48-77.

* cited by examiner

*Primary Examiner*—Dean O Takaoka
(74) *Attorney, Agent, or Firm*—Sonnenschein Nath & Rosenthal LLP

(57) ABSTRACT

An electro mechanical device including: a main body of an electro mechanical device having a lower electrode and a movable member; an overcoat film sealing the main body of the electro mechanical device by maintaining a space, wherein a support post is provided between the overcoat film and the movable member.

14 Claims, 9 Drawing Sheets

ELECTRO MECHANICAL DEVICE AND MANUFACTURING METHOD THEREOF, AND RESONATOR AND MANUFACTURING METHOD THEREOF

CROSS REFERENCES TO RELATED APPLICATIONS

The present invention contains subject manner related to Japanese Patent Application JP 2006-109097 filed in the Japanese Patent Office on Apr. 11, 2006, the entire contents of which being incorporated herein by reference.

BACKGROUND OF THE INVENTION

1. Field of the Invention

The present invention relates to an electro mechanical device and a manufacturing method thereof, and to a resonator and a manufacturing method thereof.

2. Description of the Related Art

In recent years, along with the progress of miniaturizing manufacture technique on a substrate, an electro mechanical device, a so-called micro-machine (ultra-small electrical/mechanical composite device: Micro Electro Mechanical Systems, hereinafter, referred to as MEMS) and a small device assembled with the MEMS device thereof have received a remarkable attention. The MEMS device is a device wherein a vibrator which is a movable structure body, a semiconductor integrated circuit controlling the drive of the vibrator and the like are coupled electrically/mechanically. Then, the vibrator is assembled into a portion of the device and it is constituted such that the drive of the vibrator is to be carried out electrically by applying Coulomb attraction or the like between the electrodes.

Among such MEMS devices, in particular, a device formed by using a semiconductor process has features in which a small area is occupied by the device, a high Q value (quantity indicating resonance acuteness of vibration system) can be realized, it can be integrated (unified) with another semiconductor device and the like, so that utilization as a high frequency filter for wireless communication was proposed (for example, see Patent Document 1).

Incidentally, in a case wherein the MEMS device is integrated with another semiconductor device, there was proposed a way in which the vibrator portion in the MEMS device is capsule-sealed and thereby arrangement of wiring or the like is made to be possible in further upper layer (for example, see Page 7 and Page 10 of Japanese Unexamined Patent Publication No. 2002-94328 of Patent Document 1). However, when capsule-sealing the vibrator, it is necessary to keep a space at the periphery of the variable portion of the vibrator and to make a state in which the vibrator is to be movable. The space keeping at the periphery of this variable portion is usually carried out by so-called sacrifice layer etching (see C. T.-C. Nguyen, "Micromechanical components for miniaturized low-power communications (invited plenary)", proceedings, 1999 IEEE MTT-S International Microwave Symposium RFMEMS Workshop, Jun. 18, 1999, pp. 48-77 of Non-patent Document 2).

The sacrifice layer etching means an etching in which a thin film is formed at the periphery of the variable portion of the vibrator beforehand and thereafter, this thin film is removed by etching and a space (gap) is formed at the periphery of aforesaid variable portion. Also, the thin film formed at the periphery of the variable portion in order to carry out the etching of the sacrifice layer is called a "sacrifice layer".

The research and development of the MEMS device has been developed in various kinds of fields such as various kinds of sensors, actuators, optical devices, other MEMS devices and the like other than the high frequency filter.

SUMMARY OF THE INVENTION

However, the integration of the MEMS device and another semiconductor device faces a number of problems. Generally, the aforesaid integration is carried out in a final process of a manufacturing process (for example, CMOS process) with respect to the other semiconductor device in a form in which the manufacturing process of the MEMS device (in particular, the vibrator thereof) is to be added. Consequently, in the manufacturing process of the MEMS device, the process cannot be carried out at the high temperature in order to avoid a bad influence to the semiconductor device which was already formed. In other words, it is necessary to form the vibrator at the low temperature and there is a fear that the process thereof is to become uneasy.

On the other hand, in case of capsule-sealing a portion of the vibrator in the MEMS device, it becomes possible to employ an arrangement of a wiring layer or the like on a further upper layer caused thereby, so that it is possible to avoid a bad influence of the high temperature process thereof from extending to the wiring layer or the like even if the vibrator is formed at the high temperature. However, in that case, the space at the periphery of the variable portion of the vibrator, which was formed by a sacrifice layer etching is vacuum-sealed, so that a special packaging technology by an insulating material or the like becomes necessary (for example, see Patent Document 1). That is to say, a packaging process for the vacuum seal becomes necessary, so that it is difficult to perform it in a process of an existing semiconductor process (for example, CMOS process). It is contemplated as a result that manufacturing efficiency lowering of the device including the MEMS device will be incurred.

There is shown in FIG. 11 a comparative example of a capsule-sealed electro mechanical device. FIG. 11 is an example applied to a resonator to be utilized as a high frequency filter for wireless communication. This resonator 1 is constituted, for example, by including an output electrode 7 which becomes a lower electrode 7 and a strip-shaped beam 9 which faces to this output electrode 7 through a space 8 and becomes a vibrator on a substrate 6 constituted by forming an insulation film 5 composed of a laminated film of a silicon oxide film 3 and a silicon nitride film 4 on the surface of the silicon substrate 2. The beam 9 is formed by a conductive material and becomes an electrode on the input side. The beam 9 is supported by lower portion wirings 11A, 11B formed on the substrate 6 through support portions 12A, 12B and is formed by a center impeller beam structure. There is formed on the outside of the lower portion wirings 11A, 11B with an insulation film, for example, a silicon oxide film 13 and an external wiring layer 15 by a sputtering film is formed through an opening portion 14 thereof.

On the other hand, a resonator main body 16 composed of the output electrode 7 and the beam 9 keeps a space 17 as a whole, is coated by an overcoat film 18 formed, for example, by a silicon nitride film and is sealed airtightly. This overcoat film 18 is film-made over the entire thereof in a state in which sacrifice layers are formed in the spaces 8 and 17 for the manufacturing reason. A through-hole 19 is formed after film-making the overcoat film 18 and the sacrifice layers are etching-removed selectively through the through-hole 19 and the spaces 8 and 17 are formed. The through-hole 19 is sealed by a sealing film 20 formed by a sputtering film.

In this resonator 1, when the beam which becomes a vibrator is applied with a DC bias voltage and also is applied with a specific frequency voltage, the beam 9 vibrates by an inherent vibration frequency and capacitance of a capacitor constituted by the space 8 between the output electrode 7 and the beam 9 changes so as to output a specific frequency signal from the output electrode 7.

On the other hand, in the capsule-sealed resonator 1 shown in FIG. 11, the overcoat film 18 is to contact with the upper portion of the beam 9 which becomes a vibrator on an occasion when the stiffness of the overcoat film 18 which becomes a roof for capsule-sealing is weak and it is contemplated that the resonance frequency will change or if the worst happens, the resonance might never occur.

It is contemplated, with respect to the problem of the overcoat film 18 relating to this capsule seal, that a defect such as a defective operation will occur also in a MEMS device other than the aforementioned high frequency filter by a phenomenon in which the overcoat film contacts with the beam which become a movable member.

In view of the above aspects, the present invention provides an electro mechanical device, a manufacturing method thereof, further a resonator by an electro mechanical device and a manufacturing method thereof in which an improvement of reliability is attempted by avoiding the defect in the capsule seal.

The electro mechanical device relating to the present invention has a feature in which it is constituted by providing a support post between the overcoat film sealing the main body of the electro mechanical device, which has a lower electrode, and a movable member and the aforesaid movable member.

The resonator relating to the present invention has a feature in which it is constituted by providing a support post between the overcoat film sealing the resonator main body, which has a lower electrode and a movable member, and the aforesaid movable member.

In the present invention, a support post is provided between the overcoat film and the movable member, so that it is possible to prevent the overcoat film from contacting with the movable member caused by the bending thereof.

A manufacturing method of an electro mechanical device relating to the present invention has a feature in which there are included a process forming a sacrifice layer which covers a movable member of a main body of an electro mechanical device and forming an opening portion for forming a support post which reaches the movable member in the sacrifice layer; a process forming an overcoat film and a support post on the sacrifice layer by including the opening portion; a process removing the sacrifice layer through a through-hole formed in the overcoat film and forming the overcoat film supported by the support post; and a process sealing the through-hole of the overcoat film.

A manufacturing method of a resonator relating to the present invention has a feature in which there are included a process forming a sacrifice layer which covers a movable member of a resonator main body and forming an opening portion for forming a support post which reaches the movable member in the sacrifice layer; a process forming an overcoat film and a support post on the sacrifice layer by including the opening portion; a process removing the sacrifice layer through a through-hole formed in the overcoat film and forming the overcoat film supported by the support post; and a process sealing the through-hole of the overcoat film.

In the manufacturing method of the present invention, an opening portion for forming a support post which reaches the movable member is formed in a sacrifice layer covering the movable member and the overcoat film and the support post are formed on the sacrifice layer by including the opening portion and thereafter, the sacrifice layer is removed, so that it is possible to form the support post contacting with the movable member concurrently with the overcoat film forming.

According to the electro mechanical device or the resonator relating to the present invention, the overcoat film never contacts with the movable member by means of the support post, so that the defect in the capsule seal is avoided and it is possible to attempt improvement of reliability.

According to the manufacturing method of the electro mechanical device or the resonator relating to the present invention, the support post contacting with the movable member is formed concurrently with the overcoat film forming, so that it is possible to manufacture an electro mechanical device or a resonator in which the defect in the capsule seal is avoided and the reliability is improved.

DESCRIPTION OF THE PREFERRED EMBODIMENTS

Hereinafter, exemplified embodiments of the present invention will be explained with reference to the drawings. The electro mechanical device aimed or intend by the present invention is a device of an order of micro scale or nano scale.

Figure 1:
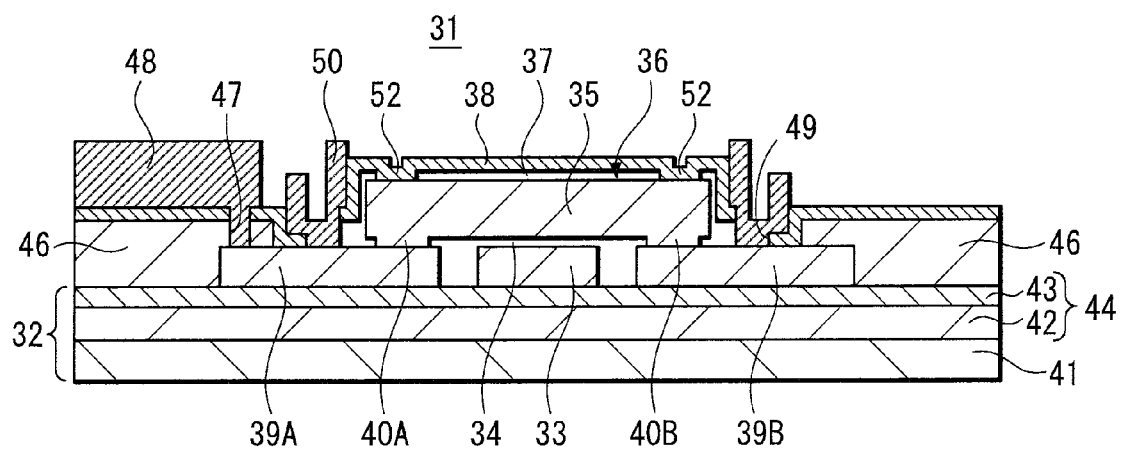
FIG. 1 is a constitution diagram showing a first exemplified embodiment of an electro mechanical device relating to the present invention.

FIG. 1 shows a first exemplified embodiment of an electro mechanical device relating to the present invention. This exemplified embodiment shows a case in which the embodiment is applied to a resonator utilized as a high frequency filter for wireless communication. An electro mechanical device 31 relating to this exemplified embodiment has a main body of an electro mechanical device (in this example, a resonator main body) 36 composed of an output electrode 33 which becomes a lower electrode on a substrate 32 and a movable member facing to this output electrode 33 through a space 34, that is, a strip-shaped beam 35 which becomes a vibrator in this example and further, it is constituted such that an overcoat film 38 is formed through a space 37 so as to coat a main body 35 of this electro mechanical device.

It is possible for the substrate 32 to use, for example, an insulating substrate such as a substrate formed with an insulation film on the semiconductor substrate, a quartz substrate, a glass substrate and the like, but in this example, in order to make integration with another semiconductor device to be possible, a substrate 32 is used in which an insulation film 44 by a laminated film of a silicon oxide ($SiO_2$) film 42 and a silicon nitride (SiN) film 43 is formed on a semiconductor substrate 41 composed of a single crystal silicon.

The beam 35 is to become an electrode on the input side and is formed by a conductive material of, for example, a polycrystal silicon film. The beam 35 is supported by lower portion wirings 39A, 39B formed on the substrate 32 through support portions 40A, 40B and is formed, so-called, as a center impeller beam structure. Also the output electrode 33, the lower portion wirings 39A, 39B and the support portions 40A, 40B are formed, for example, by polycrystal silicon films. There is formed on the outside of the lower portion wirings 39A, 39B with an insulation film, for example, a silicon oxide film 46 and there is formed on the silicon oxide film 46 thereof with an external wiring 48, for example, by a sputtering film which is connected to the lower portion wiring 39A through an opening portion 47.

The overcoat film 38, similarly as mentioned above, is film-made over the entire thereof in a state in which sacrifice layers are formed in the spaces 34 and 37 for the manufacturing reason. A through-hole 49 is formed after the overcoat film 38 is film-made, the sacrifice layer is removed by selective etching through the through-hole 49 and spaces 34, 37 are formed. Thereafter, the through-hole 49 is sealed airtightly by a sealing film 50, for example, using a sputtering film. It is possible for the sputtering film to use, for example, a sputtering film by an Al—Cu (aluminum-copper) film, an Al—Si (aluminum-silicon) film or the like.

Then, in this exemplified embodiment, in particular, support posts 52 are provided between the overcoat film 38 and the beam 35 which is a vibrator for preventing the bending of the overcoat film 38. These support posts 52 are provided corresponding to one or more positions of the beam 35. It is possible for the support posts 52 to be formed integrally with the overcoat film 38 and to be formed so as to contact with the beam 35 at one or more positions, so as not to contact therewith or so as to be integrated with the beam. In this example, the support posts 52 are formed so as to contact with both the edge portions of the beam 35, that is, at 2 places of the portions corresponding to so-called support portions 40A, 40B on the outside away from the portions defined by the length of the variable portion which contributes to the resonance frequency of the beam 35.

The overcoat film 38 is sealed airtightly for protecting the main body 36 of the electro mechanical device from the outside, but it is necessary between the overcoat film 38 and the beam 35 to provide the space 37 which will not be an obstacle for the vibration of the beam 35. The support posts 52 are posts for keeping this space 37. It will be described later with respect to preferable installation positions of the support posts 52.

In the electro mechanical device 31 relating to the first exemplified embodiment, similarly as mentioned above, a DC bias voltage is applied to the beam 35 which becomes a vibrator and at the same time, when a specific frequency voltage is applied thereto, the beam 35 vibrates by an inherent vibration frequency, the capacitance of the capacitor constituted by the space 34 between the output electrode 33 and the beam 35 changes, and this specific frequency signal is outputted from the output electrode 33. The beam 35 of this electro mechanical device 31 vibrates in a primary vibration mode.

With respect to the electro mechanical device 31 of this first exemplified embodiment, in case of utilizing it as a high frequency filter, it is possible to realize a high Q value compared with a high frequency filter utilizing a surface acoustic wave (SAW) or a thin film acoustic wave (FBAR).

Figure 2:
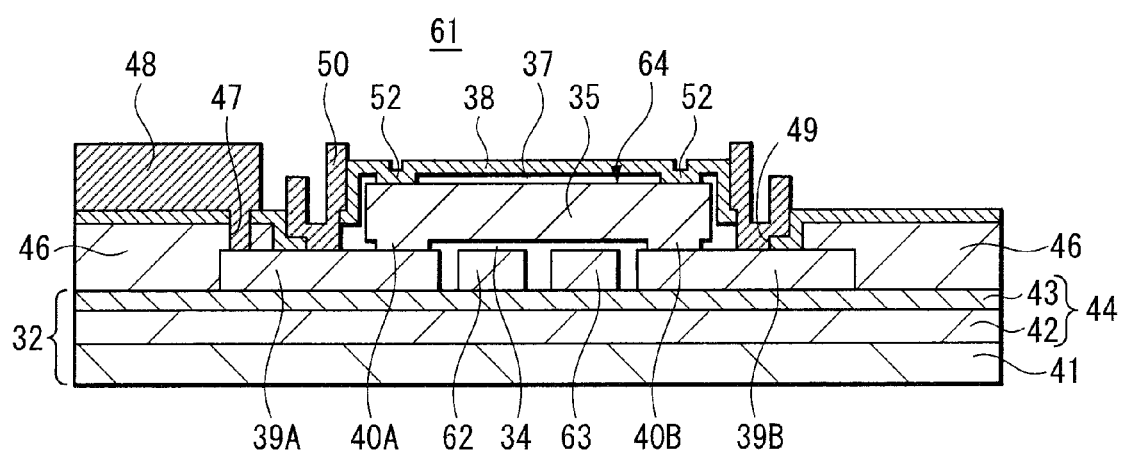
FIG. 2 is a constitution diagram showing a second exemplified embodiment of an electro mechanical device relating to the present invention.

FIG. 2 shows a second exemplified embodiment of an electro mechanical device relating to the present invention. This exemplified embodiment shows, similarly as described above, a case in which the present invention is applied to a resonator utilized as a high frequency filter for wireless communication. An electro mechanical device 61 relating to this exemplified embodiment has a main body of an electro mechanical device (in this example, a resonator main body) 64 composed of an input electrode 62 and an output electrode 63 which become lower electrodes on the substrate 32 and a movable member facing to these input and output electrodes 62, 63 through the space 34 and a movable member facing to these input and output electrodes 62, 63 and further, it is constituted such that an overcoat film 38 is formed through a space 37 so as to coat a main body 64 of this electro mechanical device.

There is used, for the substrate 32 in this example, a substrate formed with an insulation film 44 by a laminated film of a silicon oxide ($SiO_2$) film 42 and a silicon nitride (SiN) film 43 on a semiconductor substrate 41 composed of single crystal silicon. The beam 35 is formed by a center impeller beam structure in which both the edge (end portions are supported by support portions 39A, 39B. The input and output electrodes 62, 63 are formed, for example, by polycrystal silicon films.

Then, in this exemplified embodiment, similarly as the first exemplified embodiment, support posts 52 for preventing the bending of the overcoat film 38 are provided between the overcoat film 38 and the beam 35 which is a vibrator. The support posts 52 are formed integrally with the overcoat film 38 and are formed as one or more pieces on the beam 35 and in this example similarly as FIG. 1, they are formed so as to contact with the beam 35 by 2 places of both the edge portions thereof. It will be described later with respect to preferable installation positions of the support posts 52.

Other constitutions are similar as those explained for the first exemplified embodiment in FIG. 1, so that repetitive explanations thereof will be omitted by putting the same reference numerals on the corresponding portions thereof.

In the electro mechanical device 61 relating to second exemplified embodiment, a DC bias voltage is applied to the beam 35 which becomes a vibrator. Then, when a specific frequency voltage is applied to the input electrode 62, the variable portion (beam portion excluding both the edge portions supported by the so-called support portion) of the beam 35 vibrates by an inherent vibration frequency, the capacitance of the capacitor constituted by the space 34 between the output electrode 63 and the beam 35 changes, and a specific frequency signal (high frequency signal) corresponding to the inherent vibration frequency of the beam 35 is outputted from the output electrode 63. The beam 35 of this electro mechanical device 61 vibrates in a secondary vibration mode.

Also in the electro mechanical device 61 of this second exemplified embodiment, in a case wherein a high frequency filter is utilized, it is possible to realize a high Q value compared with a high frequency filter utilizing a surface acoustic wave (SAW) or a thin film acoustic wave (FBAR).

Figure 3:
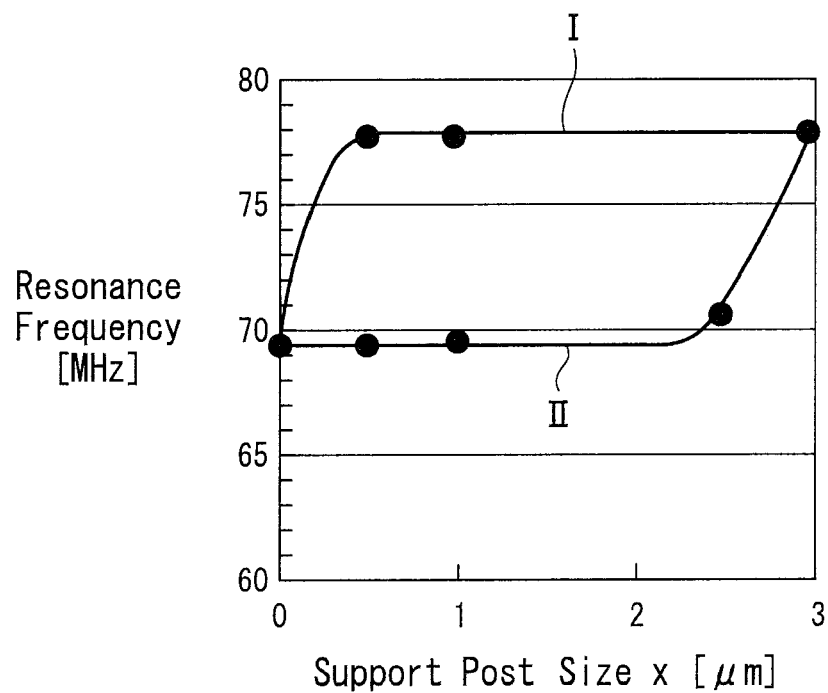
FIG. 3 is a first graph to be used for the explanation of a support post of the present invention.
Figure 4:
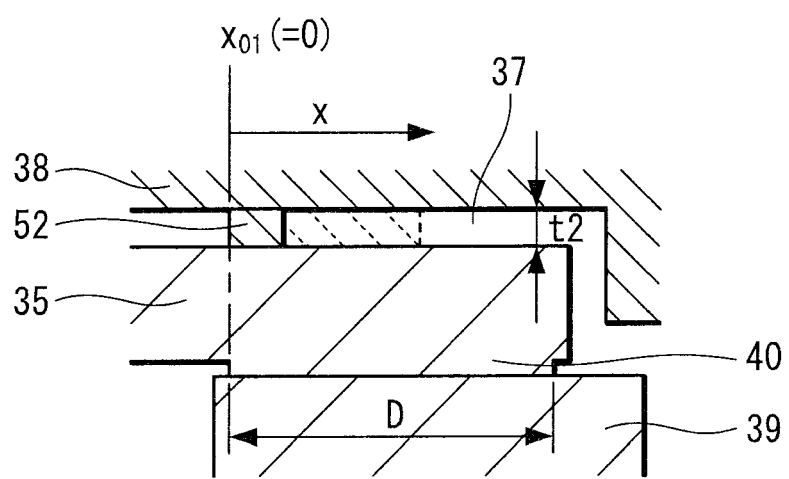
FIG. 4 is a cross-section diagram of a main portion of a first sample relating to a curve I of FIG. 3.
Figure 5:
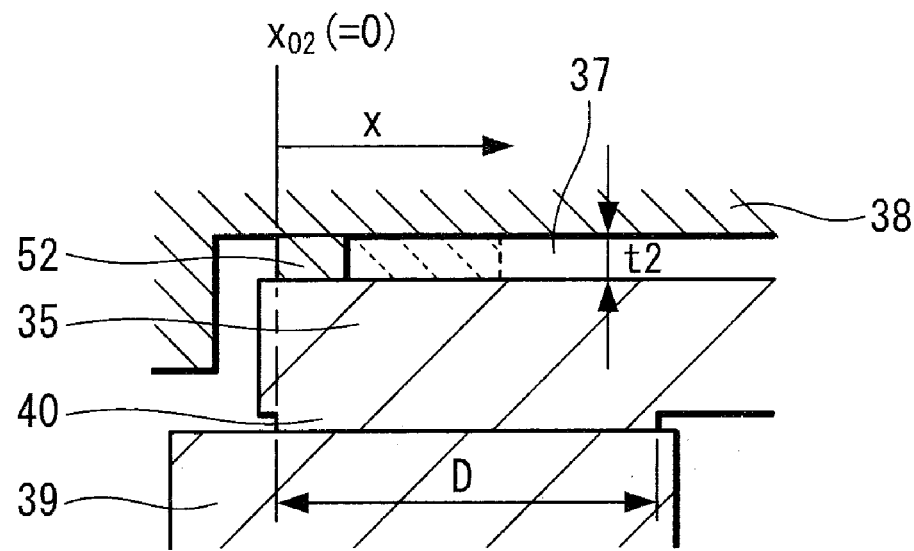
FIG. 5 is a cross-section diagram of a main portion of a second sample relating to a curve II of FIG. 3.

Next, it will be explained with respect to dimensions and the installation position of the support posts 52. It is necessary to form the support posts 52 so as not to deteriorate the vibration of the beam 35 and so as to maintain the space 37 with respect to the beam 35 such that the overcoat film 38 does not contact with the beam 35. FIG. 3 is a graph showing a relation between the size of the support post 52 and the resonance frequency of the beam 35. A curve I is a characteristic in case of providing the support posts 52 at the positions corresponding to the support portions 40 [40A, 40B] of the beam 35 and when, as shown in FIG. 4, the size (i.e. width) of the support post 52 is continuously widened directed to the outer edge side of the support portion 40 from an inner edge position $X_{01}$ of the support portion 40. A curve II is a characteristic in case of providing the support posts 52 similarly at the positions corresponding to the support portions 40 of the beam 35 and when, as shown in FIG. 5, the size (i.e. width) of the support post 52 is continuously widened directed to the inner edge side of the support portion 40 from the outer edge position $X_{02}$ of the support portion 40. Here, the width D of the support portion 40 was made to be 3.0 μm. Also, the distance t 2 of the space 37 between the overcoat film 38 and the beam 35 was made to be 0.1 μm.

In the curve I corresponding to the case of FIG. 4, there can be obtained a resonance frequency (in the vicinity of 70 MHz) of the beam 35 at a point where the support post size is X=0, which means that there is no support posts 52, but the frequency varies to 78 MHz from the instant when the support posts 52 is provided. On the other hand, in the curve II corresponding to the case of FIG. 5, a resonance frequency (in the vicinity of 70 MHz) of the beam only can be obtained in case of continuously widening the size (width) of the support post directed to the inner side from the outer edge position $X_{02}$ of the support portions 40 and even if the size (width) X of the support post is widened by 2.5 μm from the outer edge position $X_{02}$ of the support portion, but the resonance frequency varies significantly when exceeding 2.5 μm.

Figure 6:
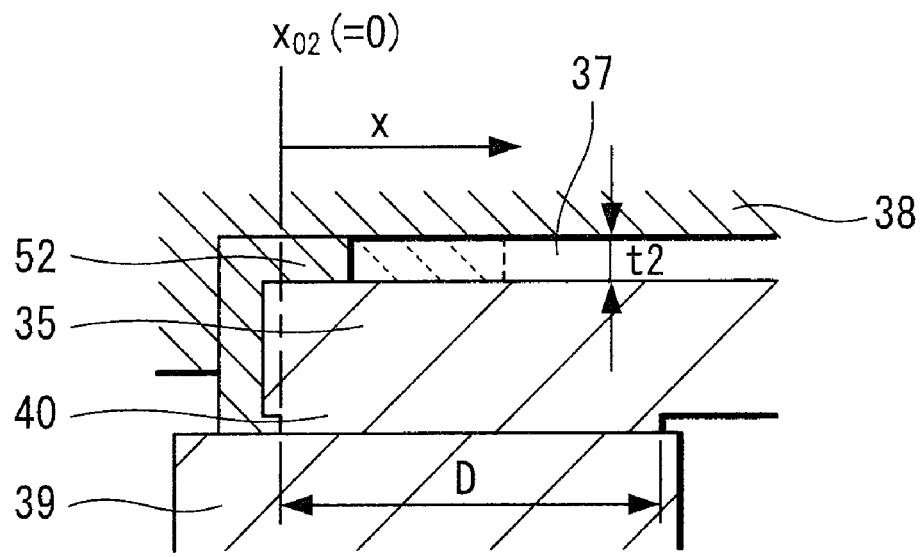
FIG. 6 is a cross-section diagram of a main portion of a third sample relating to a curve II of FIG. 3.

According to the graph of this FIG. 3, in case of forming the support post 52 continuously from the outer edge position $X_{02}$ of the support portion of the beam 35 toward the inner edge thereof, the vibration of the beam 35 is never detracted if it is within a distance by 2.5 μm from the outer edge position $X_{02}$ of the support portion. In addition, as shown in FIG. 6, the vibration of the beam 35 is never detracted also in a case in which the support post 52 is formed continuously beyond the outer edge position $X_{02}$ of the support portion. Consequently, it is preferable for the support post 52 to be provided so as to have a continuous width from a position between the position 0.5 μm apart from the inner edge position $X_{01}$ of the support portion of the beam 35 and the outer edge of the support portion including the outer edge of the support portion.

Figure 7:
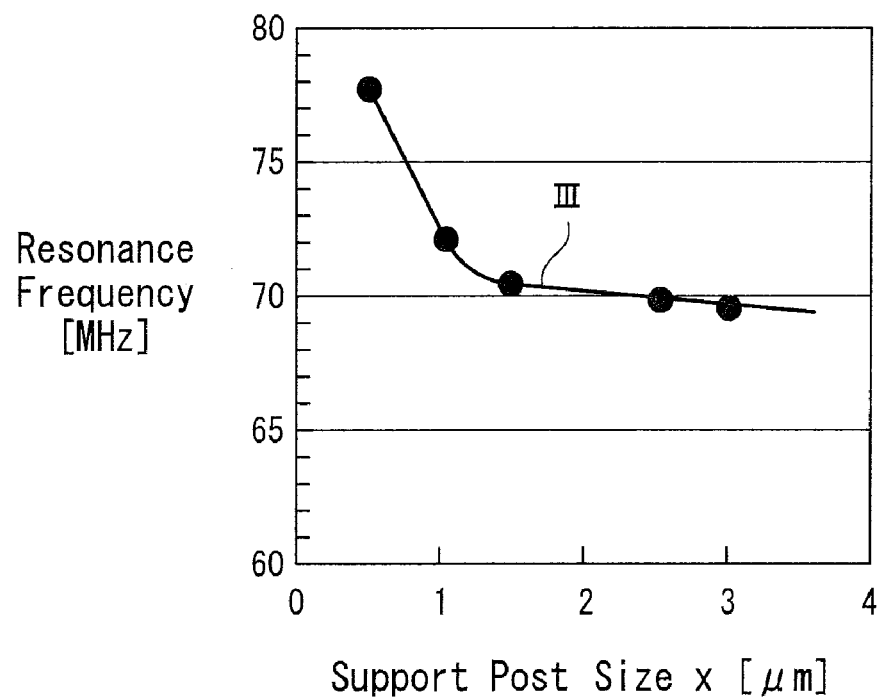
FIG. 7 is a second graph to be used for the explanation of a support post of the present invention.
Figure 8:
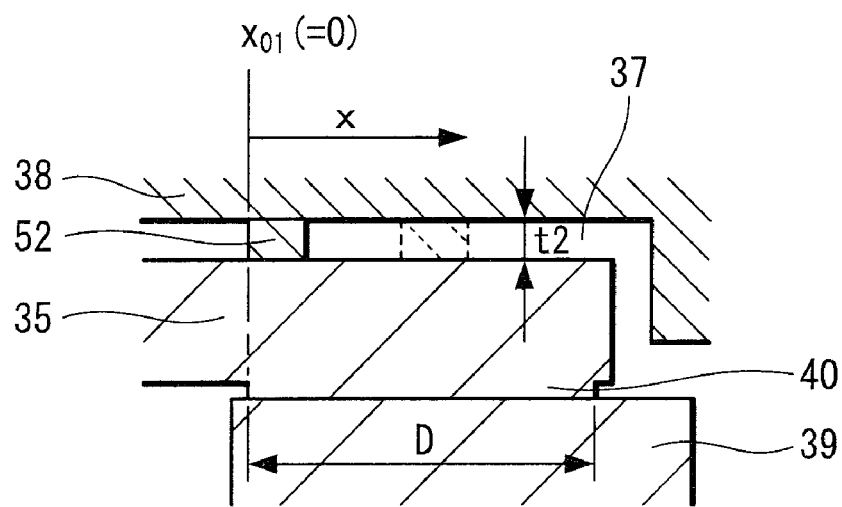
FIG. 8 is a cross-section diagram of a main portion of a fourth sample relating to a curve III of FIG. 7.

FIG. 7 is a graph showing a relation between the position of the support post 52 and the resonance frequency of the beam 35 when width W of the support post 52 is constant. The width D of the support portion 40 and the distance t 2 of the space 37 are identical to those of FIG. 4 and FIG. 5. In this example, the width W of the support post 52 is made to be 0.5 μm (five times as long as the space distance t 2). As shown in FIG. 8, the support post 52 was shifted to the outer edge side of the support portion from a state in which the position is made to be in conformity with the inner edge position $X_{01}$ of the support portion of the beam 35. As shown in a curve III of FIG. 7, in case of 0.5 μm from the inner edge position $X_{01}$ of the support portion (that is, a case in which the support post 52 having width 0.5 μm is formed to be in conformity with the inner edge position $X_{01}$), the resonance frequency of the beam 35 is varied to 78 MHz whereby fluctuation of the resonance frequency is lowered along with a movement in which the support post 52 is shifted to the outer edge side, but the resonance frequency rises rapidly at least on the inner side from 1.0 μm apart from the inner edge position $X_{01}$. If the position of the support post 52 is apart from the inner edge position $X_{01}$ by 1.0 μm or more and preferably by 1.5 μm, there can be obtained the original resonance frequency of the beam 35 (in the vicinity of 70 MHz).

According to the graph of this FIG. 7, it is preferable, when the support post 52 is provided by a constant width W, to provide the support post 52 at a position 1.0 μm or more apart from the inner edge position $X_{01}$ of the support portion of the beam 35.

According to the electro mechanical devices 31 and 61 relating to the first exemplified embodiment and the second exemplified embodiment described above, by forming the support posts 52 between the overcoat film 38 and the beam 35, the strength of the overcoat film 38 is secured and the overcoat film 38 is avoided from the bending and will never contact with the beam 35. Thereby, it is possible to carry out the airtight sealing of the main body 36 or 64 of the electro mechanical device certainly by the overcoat film 38 through the required space 37. By forming the support post 52 according to the condition explained along FIG. 3 and FIG. 7, it is possible to carry out the driving of the main body 36 or 64 of the electro mechanical device in the overcoat film 38 sealed airtightly without detracting the vibration of the beam 35, that is, by maintaining the original resonance frequency of the beam 35.

Also, the electro mechanical device 31, 61 of these exemplified embodiments make it possible to realize the integration with other semiconductor devices.

Next, one exemplified embodiment of a manufacturing method of an electro mechanical device relating to the present invention will be explained with reference to FIG. 9A to FIG. 9L. The manufacturing method of this exemplified embodiment is in case of being applied to the manufacture of the electro mechanical device 61 shown in FIG. 2.

Figure 9A:
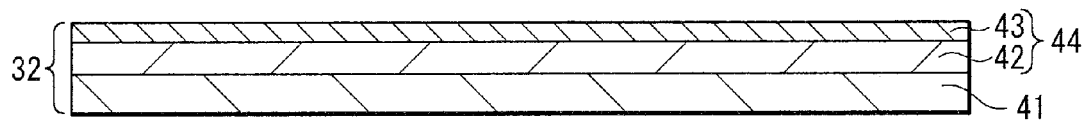
FIGS. 9A to 9E are manufacturing process diagrams (No. 1 thereof) showing one exemplified embodiment of a manufacturing method of an electro mechanical device relating to the present invention.

First, as shown in FIG. 9A, a substrate 32 is prepared in which a silicon oxide film 42 and a silicon nitride film 43 are lamination-formed as an insulation film 44 on a substrate which is a semiconductor substrate 41 by a single crystal silicon according to this example by a low pressure CVD (Chemical Vapor Deposition) method.

Figure 9B:
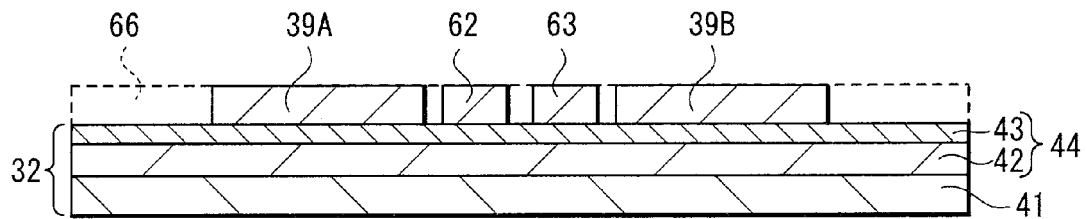

Next, as shown in FIG. 9B, there is formed on the substrate 32 with a selective-etching possible conductive film which is a polycrystal silicon film 66, according to this example, including impurities, for example, phosphorus (P). After patterning this polycrystal silicon film 66 by utilizing well known lithography technology and dry etching technology, there are formed with an input electrode 62 and an output electrode 63 which become lower electrodes and with lower portion wirings 39 [39A, 39B].

Figure 9C:
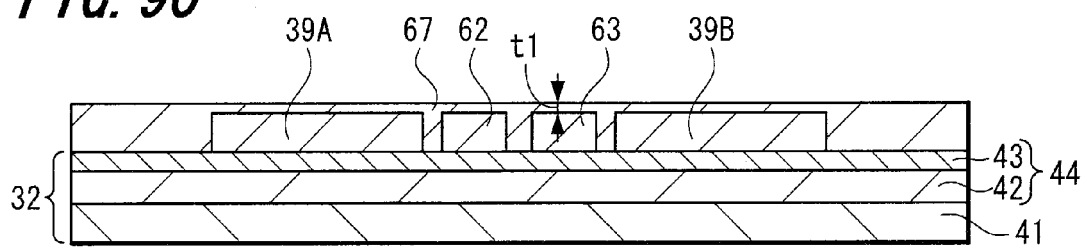

Next, as shown in FIG. 9C, for example, a silicon oxide film 67 is formed on the whole surface so as to bury the input and output electrodes 62, 63 and the lower portion wirings 39 [39A, 39B] and also so as to form the required film thickness t 1 at least on the input and output electrodes 62, 63. A portion of this silicon oxide film 67 is a layer of a sacrifice layer which will be described later.

Figure 9D:
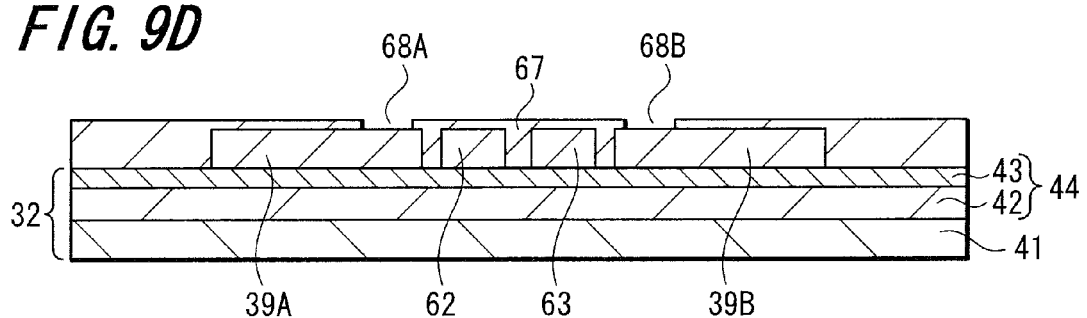

Next, as shown in FIG. 9D, a portion of the silicon oxide film 67 which becomes a sacrifice layer of the lower portion wiring 39 is etching-removed selectively by utilizing well known lithography technology and dry etching technology and an opening portions 68 [68A, 68B] are formed. These opening portions 68 are portions for forming support portions (so-called, anchor portions) of the beam which becomes a vibrator late on.

Figure 9E:
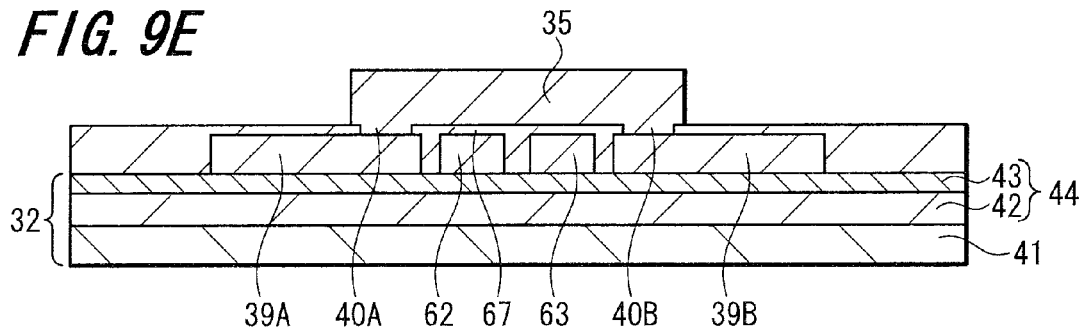

Next, as shown in FIG. 9E, a polycrystal silicon film including impurities, for example, phosphorus (P) is formed on the silicon oxide film 67 including the opening portions 68 [68A, 68], for example, by a low pressure CVD method, pattern processing is applied thereto by utilizing well known lithography technology and dry etching technology, and a strip-shaped beam 35 composed of a polycrystal silicon film and support portions 40 [40A, 40B] supporting both the edges this of the beam 35 are formed. The support portions 40 [40A, 40B] are connected to the lower portion wirings 39 [39A, 39B] respectively.

Figure 9F:
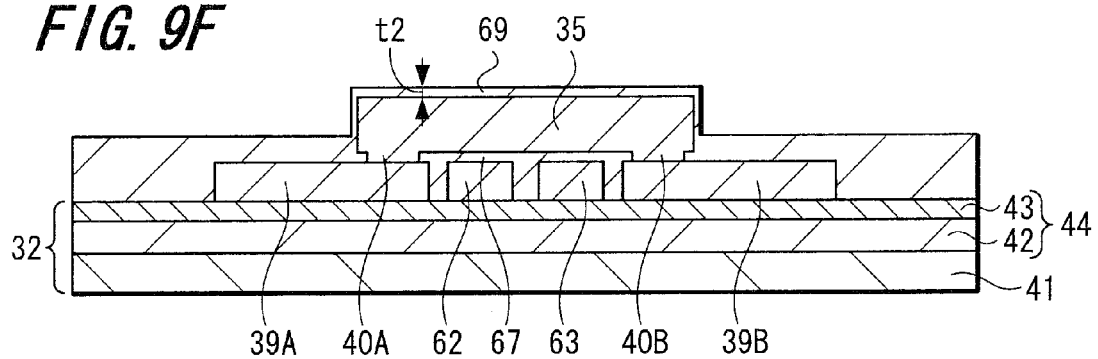
FIG. 9F to 9I are manufacturing process diagrams (No. 2 thereof) showing one exemplified embodiment of a manufacturing method of an electro mechanical device relating to the present invention.

Next, as shown in FIG. 9F, a silicon oxide film 69 is formed on the whole surface so as to coat the beam 35, for example, by a low pressure CVD method. A portion of this silicon oxide film 69 also functions as a sacrifice layer and is formed by the required film thickness t 2 at least on the beam 35.

Figure 9G:
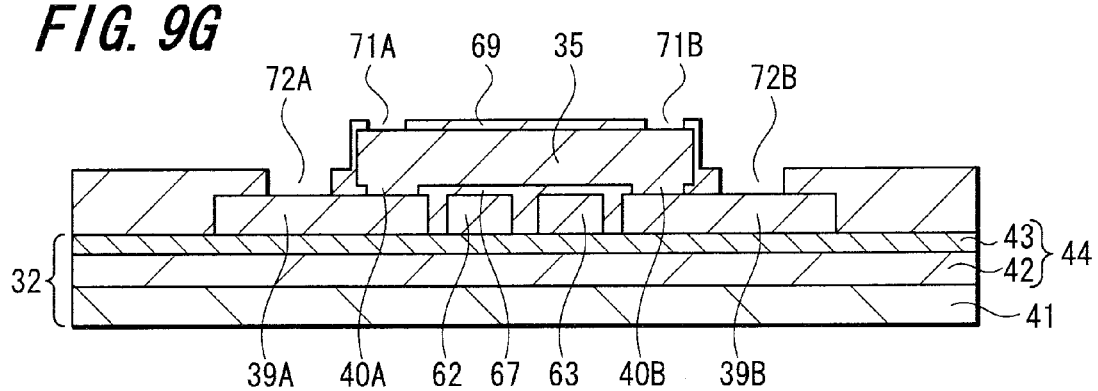

Next, as shown in FIG. 9G, the silicon oxide film 69 is pattern-processed by utilizing well known lithography technology and dry etching technology, opening portions 71 [71A, 71B are formed at the portions corresponding to the support portions 40A, 40B and at the same time, openings 72 [72A, 72B] are formed at the portion corresponding to the lower portion wirings 39A, 39B. The opening portions 71 [71A, 71B] are portions which become opening portions for forming the support posts later on and are formed at the positions which do not vary the resonance frequency of the beam as explained in FIG. 3 and FIG. 7 above.

The beam 35 is to be covered by the silicon oxide films 67 and 69 whose periphery, that is, all of the up and down surfaces and the right and left surfaces of the cross-section including the side wall portions will function as sacrifice layers. That is to say, the silicon oxide film 67 exists in the downward direction of the beam 35 cross-section and the silicon oxide film 69 exists in the right and left and upward directions of the cross-section.

Figure 9H:
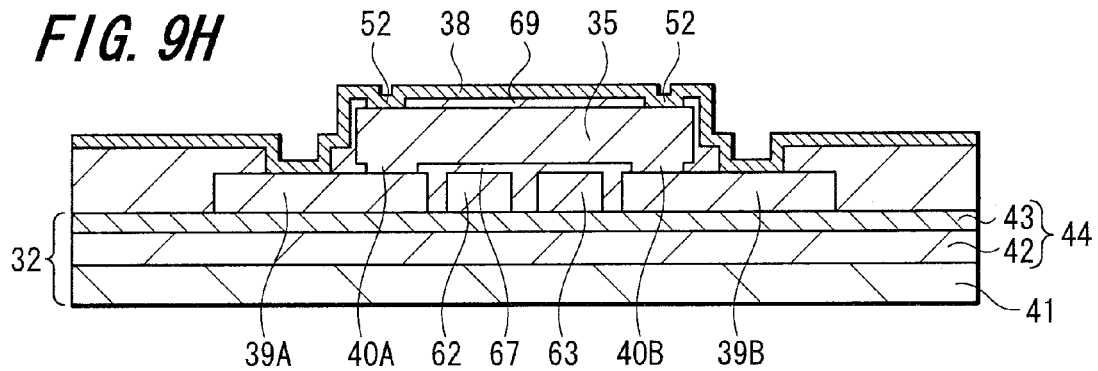

Next, as shown in FIG. 9H, a silicon nitride film 38 is formed on the whole surface of the silicon oxide film 69 which functions as the sacrifice layer including the opening portions 71 [71A, 71B] and the opening portions 72 [72A, 72B], for example, by a low pressure CVD method. This silicon nitride film 38 is a film functioning as an overcoat film. The silicon nitride film formed so as to be connected to the portions corresponding to the support portions 40A, 40B of the beam 35 through the opening portions 71A, 71B functions as the support posts 52.

Figure 9I:
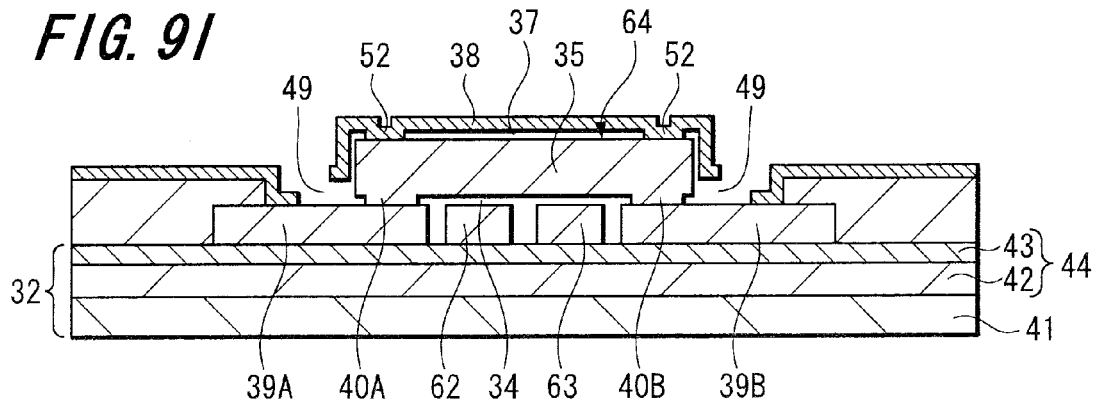

Next, as shown in FIG. 9I, portions of the silicon nitride film 38 corresponding to the opening portion 72A, 72B, which function as overcoat films, are etching-removed selectively by utilizing well known lithography technology and dry etching technology and through-holes 49 going to the sacrifice layer (any one or both of the silicon oxide film 67 and the silicon oxide film 69 and in this example, both the silicon oxide films 67 and 69) are formed. Thereafter, the sacrifice layers 67 and 67 are etching-removed selectively by using the through-holes 49 and the spaces 37 and 34 are formed at the upper and lower portions of the beam 35.

More specifically, by using an etching solution such, for example, as a hydrofluoric acid water solution (DHF solution) for removing the silicon oxide film selectively, the sacrifice layers (silicon oxide films) 67 and 69 formed in the periphery regions at the left, right, top and bottom surrounding the beam 35 are removed selectively. Thereby, the space 34 is formed between the beam 35 and the input and output electrodes 62, 63 which are the lower electrodes and at the same time, the space 37 is formed between the beam 35 and the overcoat film 38. Owing to these spaces 34, 37, the substantial variable portion excluding both the edge portions supported by the support portions 40A, 40B of the beam 35 become possible to vibrate by the inherent vibration frequency of the beam 35. Here, there are formed, so as to be covered by the overcoat film 38, with the main body of the electro mechanical device (in this example, resonator main body) 64 composed of the input and output electrodes 62, 63 of the lower electrodes and the beam 35.

Figure 9J:
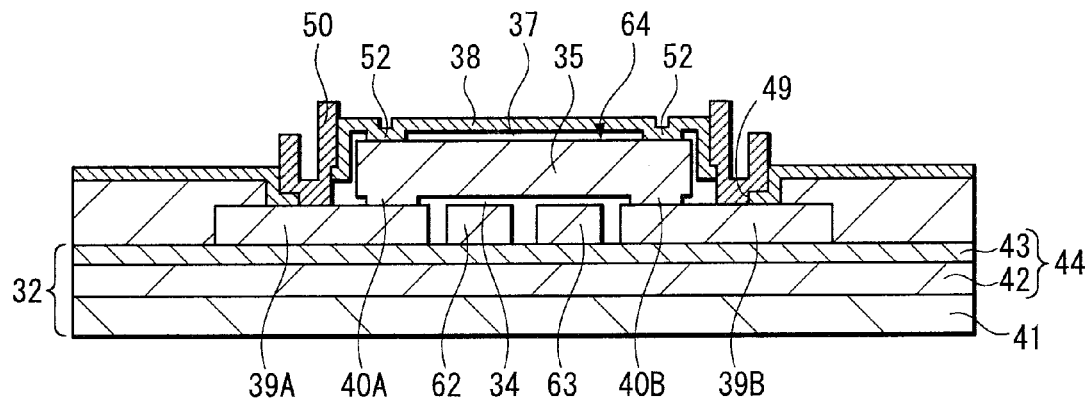
FIG. 9J to 9L are manufacturing process diagrams (No. 3 thereof) showing one exemplified embodiment of a manufacturing method of an electro mechanical device relating to the present invention.

Next, as shown in FIG. 9J, sealing films 50 are formed in the through-holes 49 by a film-making process under decompression and the main body 64 of the electro mechanical device is sealed airtightly. More specifically, a film-making process is performed, for example, by sputtering in vacuum and the sealing film 50 by the sputtering film for sealing the through-hole 49 is formed. Since a film-making process by sputtering is used, there can be cited for the reaction gas used at that time with an argon (Ar) gas which is an inert gas. Also, there can be cited for the sputtering film 50 with a thin film by a metal or a metal compound such as an Al—Cu film, an Al—Si film and the like. After the sputtering film is formed, a patterning process for keeping the sealing film 50 is carried out by utilizing well known lithography technology and dry etching technology. It should be noted in the patterning process of this sputtering film that it is also possible to form other layers such as the wiring layers and the like concurrently with the sealing film.

Figure 9K:
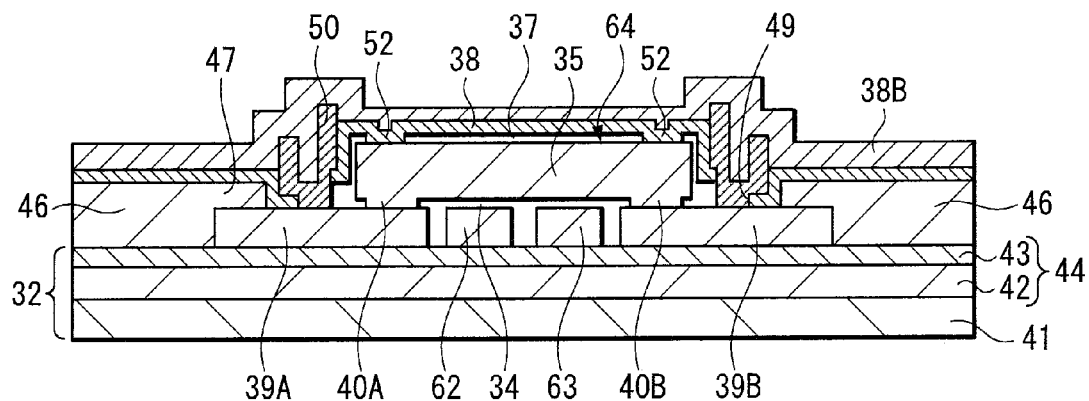

In case of not forming other wirings and the like concurrently, as shown in FIG. 9K, the surface is further protected by an insulation film (silicon oxide film) 38B.

Figure 9L:
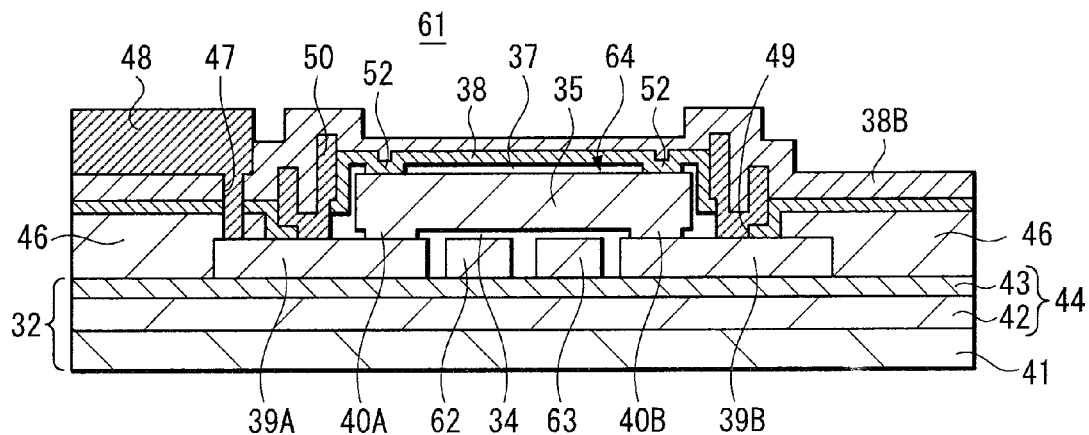

Next, as shown in FIG. 9L, an openings 47 is formed so as to reach the lower portion wiring 39A through the insulation film (silicon oxide film) 38B, the silicon nitride film 38 and the silicon oxide films 69, 67 thereunder by utilizing well known lithography technology and dry etching technology and thereafter, for example, a sputtering film similar as mentioned above is formed, patterning of this film is performed by utilizing well known lithography technology and dry etching technology, and an external wiring 48 connected to the lower portion wiring 39A is formed. It should be noted that the silicon oxide films 69, 67 formed at the periphery of the main body 64 of the electro mechanical device corresponds to the insulation film 46 explained in FIG. 2. In this manner, the main body 64 of the electro mechanical device is sealed airtightly by the overcoat film 38 and at the same time, the aimed electro mechanical device 61 in which the support posts 52 are formed between the overcoat film 38 and the beam 35 can be obtained.

According to the manufacturing method of then electro mechanical device relating to this exemplified embodiment, by forming the support posts 52 connected from the overcoat film 38 to the beam 35 concurrently with the forming of the overcoat film 38 which seals the main body 64 of the electro mechanical device airtightly, it is possible to prevent the bending of the overcoat film 38 by keeping the strength of the overcoat film 38 and to manufacture the electro mechanical device 61 of a capsule sealing structure in which the movable range of the beam 35 is secured and the reliability is high.

There are included a process for forming the silicon oxide film 67 and the silicon oxide film 69 which function as sacrifice layers at the periphery of the beam 35, a process for covering the top of the sacrifice layer 69 thereof by the silicon nitride film 38 which is an overcoat film, and a process for etching the sacrifice layers, so that it becomes possible to arrange wiring layers or the like on the further upper layer of the overcoat film 38. More specifically, it is possible after these processes to perform the forming process of the wiring layers or the like. Consequently, by forming the beam 35 in the front-end process thereof, it is possible to form the beam 35 in a lower layer than the metal wiring or the like, so that even if this beam 35 is formed by high temperature, the bad influence of the high temperature process never extends to the wiring layer or the like and as a result, it is possible to attempt easy forming of the beam 35.

Furthermore, there is included a process for sealing the through-hole 49 in which a film-making process by sputtering is performed after etching the sacrifice layer, so that owing to the process thereof, the substantial periphery of the variable portion of the beam 35, that is, the spaces 34, 37 of the so-called periphery of the variable portion are sealed. Consequently, it never require a special package technology by an insulating material or the like. More specifically, it is possible to seal the spaces 34, 37 at the periphery of the variable portion of the beam 35, which was formed by etching the sacrifice layer without requiring a packaging process for the vacuum seal.

In addition, it is contemplated that the sputtering film for the seal may be used also as the wiring or the like. That is to say, it is contemplated that the through-hole 49 is to be sealed by utilizing the sputtering film for the wiring or the like. In that case, the forming of the seal and the wiring or the like can be realized by the same process and it is very effective when efficiency promotion of the manufacturing process is attempted.

Further, the through-hole 49 is sealed in the film-making process by sputtering, so that it becomes possible to be realized by directly utilizing film-making technology in a semiconductor process, for example, a CMOS process and it becomes possible to be carried out together with another process in this semiconductor process continuously. More specifically, the sealing in the so-called inline becomes possible. Consequently, integration to the CMOS process or the like is very easy and at the same time, it become also possible to carry out evaluation of the electro mechanical device in a wafer state.

Based on these facts, if the electro mechanical device is constituted by using the manufacturing method explained in this exemplified embodiment, manufacturing of the electro mechanical device can be carried out in the process of an existing semiconductor process, for example, a CMOS process even in a case where the electro mechanical device is integrated with another semiconductor device and as a result, it is possible to improve manufacturing efficiency of the device including the electro mechanical device.

In particular, as explained in this exemplified embodiment, it becomes the sealing in an Ar gas which is an inert gas in case of carrying out the sealing in the film-making process by sputtering, and it can be said to be very preferable in a point of safety or reliability.

The manufacturing method by the procedures explained in FIG. 9A to FIG. 9L is not limited only for the electro mechanical device 61 having constitution shown in FIG. 2, but it is applicable also to other electro mechanical devices if sacrifice layer etching is carried out therein by using the through-hole provided in the overcoat film.

The electro mechanical device and the manufacturing method thereof according to this exemplified embodiment is applicable also to the electro mechanical device 31 in FIG. 1. Also, it is applicable to an electro mechanical device in which the main bodies of a plurality of electro mechanical devices (resonator main bodies) are parallelized, for example, to an electro mechanical device constituted by arranging a plurality of beams having common input and output electrodes.

The electro mechanical device and the manufacturing method thereof according to this exemplified embodiment is applicable to electro mechanical devices to be used in various kinds of fields of various kinds of sensors, actuators, optical devices (including GLV devices which become optical modulation devices), others and the like other than the resonators of high frequency filters and the like. In case of applying the beam as an electro mechanical device other than using it as a vibrator of a required resonance frequency, it is better to locate the support post at a position corresponding to the support portion at the beam edge portion in order not to cause fluctuation in the movability of the beam.

The above described electro mechanical device, for example, the resonator of the exemplified embodiment can be used as a band signal filter such as a high frequency (RF) filter, an intermediate frequency (IF) filter or the like.

Also, there can be provided as another exemplified embodiment of the present invention with a communication apparatus using a filter by such an electro mechanical device. More specifically, there can be also provided with a communication apparatus such as a mobile phone, wireless LAN equipment, a wireless transceiver, a television tuner, a radio tuner or the like which is constituted by using a filter according to the electro mechanical device relating to the above described exemplified embodiment and communicates by utilizing an electromagnetic wave.

Next, a constitution example of a communication apparatus applied with the filter of this embodiment will be explained with reference to FIG. 10.

First, it will be explained with respect to constitution of a transmission system, wherein transmission data of an I channel and a Q channel are supplied to digital/analog converters (DACs) 201I and 201Q respectively so as to be converted to analog signals.

The converted signals of the respective channels are supplied to band-pass-filters 202I and 202Q so as to remove signal components other than the bandwidth of the transmission signals and the outputs of the band-pass-filters 202I and 202Q are supplied to a modulator 210.

In the modulator 210, the signals are supplied to mixers 212I and 212Q for the respective channels through buffer amplifier 211I and 211Q and modulated by being mixed with frequency signals corresponding to the transmission frequency supplied from a PLL (phase-locked loop) circuit 203 for transmission, and both the mixed signals are added in an adder 214 so as to be a transmission signal of a single system. In this case, the frequency signal supplied to the mixer 212I is to be 90° shifted by a phase shifter 213 for the signal phase thereof and it is constituted such that the I channel signal and the Q channel signal are to be quadrature modulated.

The output of the adder 214 is supplied to a power amplifier 204 through a buffer amplifier 215 and is amplified therein so as to have a predetermined transmission power. The signal amplified in the power amplifier 204 is supplied to an antenna 207 through a transmission and reception switcher 205 and a high frequency filter 206 and is transmitted wirelessly from the antenna 207. The high frequency filter 206 is a band-passfilter for removing signal components other than the frequency band transmitted and received by this communication apparatus.

For the constitution of the reception system, the signal received by the antenna 207 is supplied to a high frequency portion 220 through the high frequency filter 206 and the transmission and reception switcher 205. In the high frequency portion 220, the reception signal is amplified in a low noise amplifier (LNA) 221 and thereafter is supplied to a band-pass-filter 222 wherein signal components other than the received frequency band are removed, and the removed signal is supplied to a mixer 224 through a buffer amplifier 223. Then, a frequency signal supplied from a PLL circuit 251 for channel selection is mixed thereto so as to make a signal of a predetermined transmission channel to be an intermediate frequency signal and the intermediate frequency signal is supplied to an intermediate frequency circuit 230 through a buffer amplifier 225.

In the intermediate frequency circuit 230, the supplied intermediate frequency signal is supplied to a band-pass-filter 232 through a buffer amplifier 225 wherein signal components other than the bandwidth of the intermediate frequency signal are remove, and the remove signal is supplied to an automatic gain control circuit (AGC circuit) 233 so as to be a signal having an approximately constant gain. The intermediate frequency signal gain adjusted in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 and a frequency signal supplied from a PLL circuit 252 for intermediate frequency is mixed thereto so as to demodulate signal component of the I channel and signal component of the Q channel, which were received. In this case, the mixer 242I for the I signal is constituted such that a frequency signal whose signal phase is 90° shifted by a phase shifter 243 is to be supplied thereto and an I channel signal component and a Q channel signal component which are quadrature modulated are demodulated.

The demodulated I channel and Q channel signals are supplied to band-pass-filters 253I and 253Q through buffer amplifiers 244I and 244Q respectively wherein signal components other than the I channel and Q channel signals are removed, and the removed signals are supplied to analog/digital converters (ADC) 254I and 254Q so as to obtain digital data by sampling therein and there are obtained I channel received data and Q channel received data.

In the constitution so far explained, it is possible for a portion or the whole of each of the band-pass-filters 202I, 202Q, 206, 222, 232, 253I and 253Q to be applied with a filter having the constitution of this invention so as to limit the bandwidth.

Figure 10:
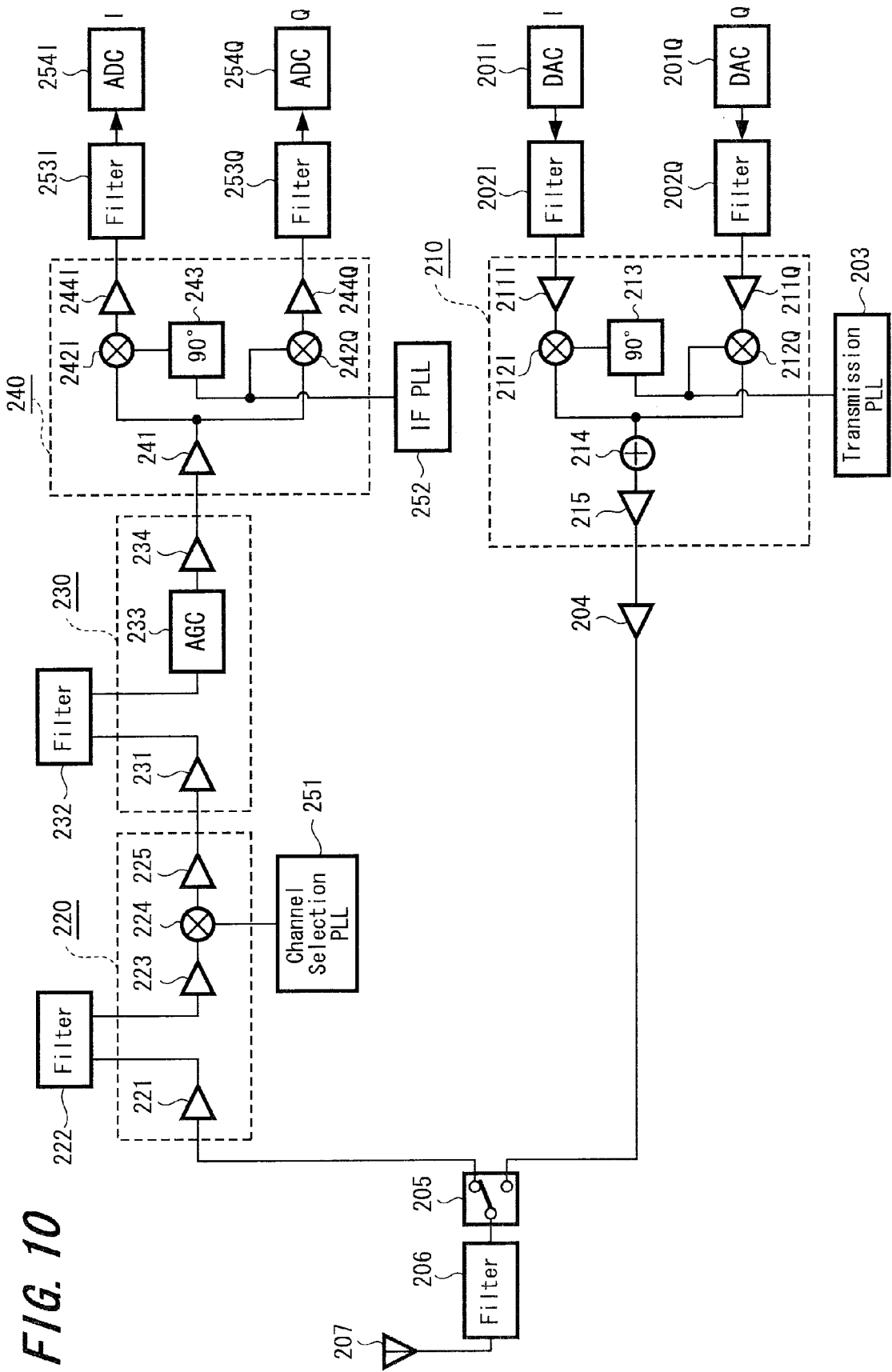
FIG. 10 is a circuit diagram showing one exemplified embodiment of a communication apparatus provided with an electro mechanical device relating to the present invention as a band filter.
Figure 11:
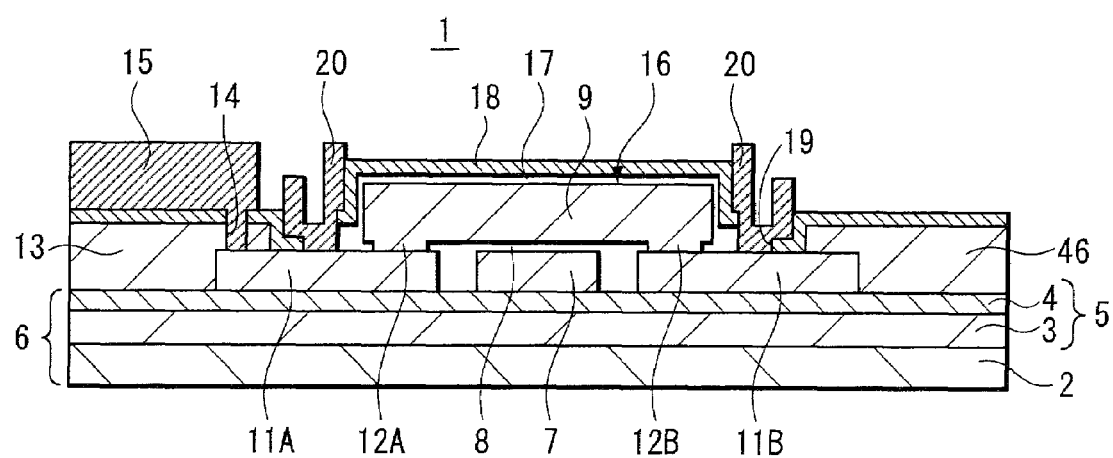
FIG. 11 is a constitution diagram of an electro mechanical device relating to a comparative example.

In the example of FIG. 10, the respective filters are constituted as band-pass-filters, but it may be allowed to constitute them as low-pass-filters for passing only the frequency band lower than a predetermined frequency or as high-pass-filters for passing only the frequency band higher than a predetermined frequency, wherein the filters having the constitutions according this embodiment are to be applied to these filters.

Also, in the example of FIG. 10, a communication apparatus carrying out wireless transmission and wireless reception was cited, but the present invention may be applied to a filter provided in a communication apparatus carrying out transmission and reception through a cable transmission path and further, it may be allowed to apply the filter having the constitution of the present invention to a filter provided in a communication apparatus carrying out only the transmission process or provided in a communication apparatus carrying out only the receiving process.

According to the communication apparatus by the above described exemplified embodiments, it is possible to provide a communication apparatus having high reliability by using a filter according to a capsule-sealed electro mechanical device of the present invention as a band filter.

It should be understood by those skilled in the art that various modifications, combinations, sub-combinations and alterations may occur depending on design requirements and other factors insofar as they are within the scope of the appended claims or the equivalents thereof.

What is claimed is:

1. An electro mechanical device comprising:
   a main body of an electro mechanical device having a lower electrode and a movable member;
   an overcoat film sealing the main body of said electro mechanical device by maintaining a space, wherein
   a support post is provided between said overcoat film and said movable member.

2. The electro mechanical device according to claim 1, wherein said support post is provided corresponding to one or more positions of said movable member.

3. The electro mechanical device according to claim 1, wherein said support post is provided at the position corresponding to the support portion of said movable member.

4. A resonator comprising:
   a resonator main body having a lower electrode and a movable member;
   an overcoat film sealing said resonator main body by maintaining a space, wherein
   a support post is provided between said overcoat film and said movable member.

5. The resonator according to claim 4, wherein said support post is provided corresponding to one or more positions of said movable member.

6. The resonator according to claim 4, wherein said support post has a width which is continuous from an arbitrary position between a position apart from the inner side edge of the support portion of said movable member by 0.5 μm and an outside edge of the support portion by including said outside edge.

7. The resonator according to claim 4, wherein said support post has a constant width and is provided at an arbitrary position between a position apart from an inner side edge of a support portion of said movable member by 1.0 μm and an outside edge of the support portion.

8. A manufacturing method of an electro mechanical device comprising steps of:
   forming a sacrifice layer which covers a movable member of a main body of an electro mechanical device and forming an opening portion for forming a support post which reaches said movable member in said sacrifice layer;
   forming an overcoat film and a support post on said sacrifice layer by including said opening portion;
   removing said sacrifice layer through a through-hole formed in said overcoat film and forming said overcoat film supported by said support post; and
   sealing the through-hole of said overcoat film.

9. The manufacturing method of an electro mechanical device according to claim 8, wherein said support post is formed so as to correspond to one or more positions of said movable member.

10. The manufacturing method of an electro mechanical device according to claim 8, wherein said support post is provided at a position corresponding to the support portion of said movable member.

11. A manufacturing method of a resonator comprising steps of:
- forming a sacrifice layer which covers a movable member of a resonator main body and forming an opening portion for forming a support post which reaches said movable member in said sacrifice layer;
- forming an overcoat film and a support post on said sacrifice layer by including said opening portion;
- removing said sacrifice layer through a through-hole formed in said overcoat film and forming said overcoat film supported by said support post; and
- sealing the through-hole of said overcoat film.

12. The manufacturing method of a resonator according to claim 11, wherein said support post is formed so as to correspond to a one or more positions of said movable member.

13. The manufacturing method of a resonator according to claim 11, wherein said support post is formed so as to have a width which is continuous from an arbitrary position between a position apart from the inner side edge of the support portion of said movable member by 0.5 µm and an outside edge of the support portion by including said outside edge.

14. The manufacturing method of a resonator according to claim 11, wherein said support post is formed so as to have a constant width and to exist at an arbitrary position between a position apart from an inner side edge of a support portion of said movable member by 1.0 µm and an outside edge of the support portion.

* * * * *